United States Patent
Jojima et al.

(10) Patent No.: US 10,630,192 B2
(45) Date of Patent: Apr. 21, 2020

(54) POWER CONVERTER

(71) Applicant: TOYOTA JIDOSHA KABUSHIKI KAISHA, Toyota-shi, Aichi (JP)

(72) Inventors: Yuki Jojima, Nagoya (JP); Shuichi Iwata, Nisshin (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/397,067

(22) Filed: Apr. 29, 2019

(65) Prior Publication Data
US 2019/0363639 A1    Nov. 28, 2019

(30) Foreign Application Priority Data

May 28, 2018 (JP) .................................. 2018-101800

(51) Int. Cl.
*H02M 7/00* (2006.01)
*H05K 7/14* (2006.01)
*H02M 7/493* (2007.01)

(52) U.S. Cl.
CPC ........... *H02M 7/003* (2013.01); *H02M 7/493* (2013.01); *H05K 7/1432* (2013.01)

(58) Field of Classification Search
CPC ............... H02M 7/003; H02M 7/5387; H02M 2001/0009; H02M 7/537; H02M 1/4225; H02M 3/1584; H02M 1/32; H02M 7/219; H02M 7/797; H02M 2001/007; H02M 1/08; H02M 7/487; H02M 1/4208; H02M 7/493; H02M 3/158; H02M 1/088; H02M 2001/327; H05K 7/1432
See application file for complete search history.

(56) References Cited

U.S. PATENT DOCUMENTS

| | | | | |
|---|---|---|---|---|
| 9,461,451 | B2 * | 10/2016 | Sawada | H05K 7/1432 |
| 2010/0132193 | A1 * | 6/2010 | Yoshinaga | H01L 25/072 29/874 |
| 2010/0226158 | A1 * | 9/2010 | Yamahira | H01R 13/6474 363/132 |
| 2012/0006595 | A1 * | 1/2012 | Tachibana | H02M 7/003 174/74 R |
| 2013/0113090 | A1 | 5/2013 | Atsumi | |
| 2013/0121052 | A1 * | 5/2013 | Yamaura | H02M 7/003 363/131 |
| 2014/0355221 | A1 * | 12/2014 | Sawada | H05K 7/1432 361/735 |

FOREIGN PATENT DOCUMENTS

| JP | 5541362 B2 | 7/2014 | |
|---|---|---|---|
| JP | 2015139270 A * | 7/2015 | .............. H02M 7/48 |

* cited by examiner

*Primary Examiner* — Adam B Dravininkas
(74) *Attorney, Agent, or Firm* — Oliff PLC (57) ABSTRACT

A power converter may include four power modules and a bus bar connecting the four power modules, wherein the bus bar may include: a first bus bar piece connecting a negative terminal of a first power module and a positive terminal of a second power module adjacent to the first power module; a second bus bar piece connecting a negative terminal of a third power module and a positive terminal of a fourth power module adjacent to the third power module; and a plurality of connecting bus bar pieces connecting the first bus bar piece and the second bus bar piece. At least one of the connecting bus bar pieces may connect a center of the first bus bar piece and a center of the second bus bar piece.

5 Claims, 7 Drawing Sheets

| | Embodiment | Comparative Example 1 | Comparative Example 2 | Comparative Example 3 |
|---|---|---|---|---|
| Form |  30 |  |  |  |
| Current Unbalance | A | A | B | C |
| Gate Oscillation | A | B | A | B |
| Inductance | A | A | B | C |

FIG. 7

POWER CONVERTER

CROSS-REFERENCE TO RELATED APPLICATION

This application claims priority to Japanese Patent Application No. 2018-101800 filed on May 28, 2018, the contents of which are hereby incorporated by reference into the present application.

TECHNICAL FIELD

The technique disclosed herein relates to a power converter that comprises a plurality of power modules, each of which houses a switching element. Especially, the technique disclosed herein relates to a power converter in which at least two power modules are connected in parallel.

BACKGROUND

In a power converter that uses a switching element for power conversion, a power module that houses the switching element may be used. Japanese Patent No. 5541362 describes a power converter that uses a power module housing two switching elements.

To increase a current capacity of a power converter, there may be a case where a plurality of power modules, each of which houses a switching element, is connected in parallel. The switching elements in the respective power modules are driven in synchrony. The plurality of power modules connected in parallel operates as if a single power module operated. Current that flows in the power converter is distributed to the power modules connected in parallel, by which the current capacity of the power converter as a whole is increased.

SUMMARY

If there is a resistance difference between current paths in a case where a plurality of power modules is connected in parallel, a difference in loads of the power modules may be caused thereby. In another case, if there is a resistance difference between the current paths, gate oscillation may occur. The disclosure herein provides a technique that reduces a resistance difference between current paths for a power converter in which a plurality of power modules is connected in parallel.

A power converter disclosed herein may comprise four power modules arranged in a first direction, the four power modules including a first power module, a second power module, a third power module and a fourth power module, each of the four power modules housing a switching element; and a bus bar connecting the four power modules, wherein each of the four power modules comprises a positive terminal and a negative terminal, each of the positive terminal and the negative terminal being conductive to the switching element, the positive terminals and the negative terminals are arranged in a second direction intersecting the first direction, the positive terminals and the negative terminals extend along a third direction intersecting both of the first direction and the second direction, the bus bar comprises: a first bus bar piece connecting the negative terminal of the first power module and the positive terminal of the second power module adjacent to the first power module; a second bus bar piece connecting the negative terminal of the third power module and the positive terminal of the fourth power module adjacent to the third power module; and a plurality of connecting bus bar pieces connecting the first bus bar piece and the second bus bar piece, the plurality of connecting bus bar pieces extending along the first direction, and at least one of the connecting bus bar pieces connects a center of the first bus bar piece in the second direction and a center of the second bus bar piece in the second direction.

DETAILED DESCRIPTION

Representative, non-limiting examples of the present disclosure will now be described in further detail with reference to the attached drawings. This detailed description is merely intended to teach a person of skill in the art further details for practicing preferred aspects of the present teachings and is not intended to limit the scope of the present disclosure. Furthermore, each of the additional features and teachings disclosed below may be utilized separately or in conjunction with other features and teachings to provide improved a power converter.

Moreover, combinations of features and steps disclosed in the following detailed description may not be necessary to practice the present disclosure in the broadest sense, and are instead taught merely to particularly describe representative examples of the present disclosure. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

One aspect of a power converter of may comprise four power modules arranged in a first direction and a bus bar connecting the four power modules. The four power modules may include a first power module, a second power module, a third power module and a fourth power module, and each of the four power modules may house a switching element. Each of the four power modules may comprise a positive terminal and a negative terminal, and each of the positive terminal and the negative terminal may be electrically connected to the switching element. The positive terminals and the negative terminals may be arranged in a second direction intersecting the first direction, and the positive terminals and the negative terminals may extend along a third direction intersecting both of the first direction and the second direction. The "bus bar" means a conductive member configured from a metal plate (or a metal bar). The bus bar may comprise a first bus bar piece, a second bus bar piece and a plurality of connecting bus bar pieces. Although the bus bar is configured from a single metal plate, for convenience of explanation, the above-mentioned names are given to parts thereof. The first bus bar piece may connect the negative terminal of the first power module and the positive terminal of the second power module adjacent to the first power module. The second bus bar piece may connect the negative terminal of the third power module and the positive terminal of the fourth power module adjacent to the third power module. That is, the first bus bar piece connects the first power module and the second power module in series and the second bus bar piece connects the third power module and the fourth power module in series. The plurality of connecting bus bar pieces may extend along the first direction and may connect the first bus bar piece and the second bus bar piece. That is, one of the connecting bus bar pieces connects the negative terminals of the first power module and the third power module and connects the positive terminals of the second power module and the fourth power module. At least one of the connecting bus bar pieces may connect a center of the first bus bar piece in the second direction and a center of the second bus bar piece in the second direction.

According to the structure above, especially, according to the structure of the plurality of connecting bus bar pieces, a resistance difference between current paths of the power modules connected in parallel is reduced. When the resistance difference is reduced, gate oscillation is less likely to occur. Further, since the plurality of connecting bus bar pieces connects the first bus bar piece and the second bus bar piece by a shortest distance, an internal inductance of the connecting bus bar piece can also be reduced.

EMBODIMENTS

Figure 1:
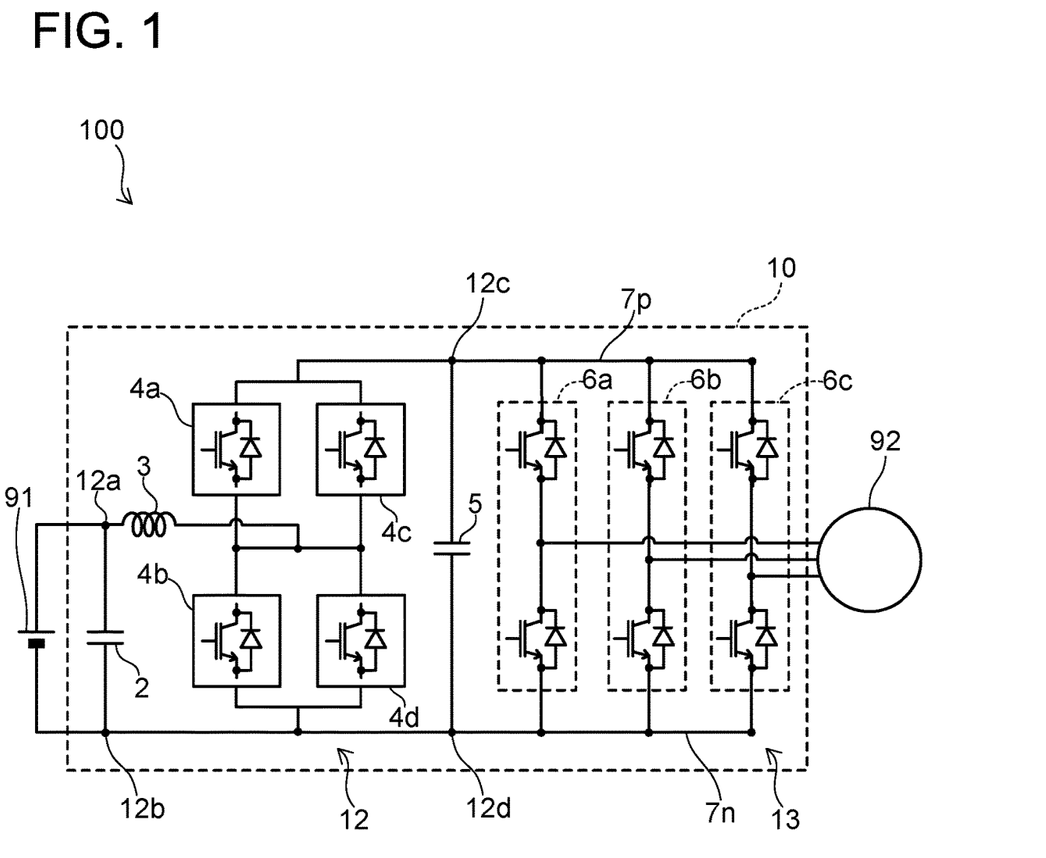
FIG. 1 is a block diagram of a power system of an electric vehicle including a power converter according to an embodiment.

A power converter according to an embodiment will be described with reference to the drawings. The power converter according to the embodiment is mounted in an electric vehicle. FIG. 1 shows a block diagram of a power system of an electric vehicle 100 including a power converter 10. Firstly, an overall circuit configuration of the power converter 10 will be described.

The power converter 10 is provided with a voltage converter circuit 12 and an inverter circuit 13. A battery 91 is connected to low-voltage terminals 12a, 12b of the voltage converter circuit 12 (that is, input terminals of the power converter 10). DC terminals of the inverter circuit 13 are connected respectively to high-voltage terminals 12c, 12d of the voltage converter circuit 12. A capacitor 5 for smoothing current is connected between the voltage converter circuit 12 and the inverter circuit 13. A motor 92 is connected to AC terminals of the inverter circuit 13. The electric vehicle 100 is configured to travel by using the motor 92. When the vehicle decelerates, the motor 92 generates electricity by using inertial energy of the vehicle. AC power (regenerative power) obtained by the electricity generation is converted to DC power by the power converter 10, and is stored in the battery 91.

The voltage converter circuit 12 will be described. The voltage converter circuit 12 is provided with a filter capacitor 2, a reactor 3, and a plurality of power modules 4a to 4d.

When one of the power modules 4a to 4d is mentioned without any distinction therebetween, it will be denoted as a power module 4.

Although the details will be described later, each of the power modules 4 houses three switching elements and three diodes in a body thereof. The three switching elements are connected in parallel, and each of the diodes is connected in inverse parallel to corresponding one of the switching elements.

The power modules 4a and 4c are connected in parallel, and the power modules 4b and 4d are also connected in parallel. A pair of the power modules 4a, 4c and a pair of the power modules 4b, 4d are connected in series. The series connection of the pair of the power modules 4a, 4c and the pair of the power modules 4b, 4d is connected between the high-voltage terminals 12c, 12d. One end of the reactor 3 is connected to a midpoint of the series connection of the power modules 4a to 4d. Another end of the reactor 3 is connected to a positive electrode 12a of the low-voltage terminal. The filter capacitor 2 is connected between the positive electrode 12a of the low-voltage terminal and a negative electrode 12b of the low-voltage terminal. The negative electrode 12b of the low-voltage terminal and a negative electrode 12d of the high-voltage terminal are directly connected.

The voltage converter circuit 12 has a step-up function to step up a voltage applied to the low-voltage terminals 12a, 12b and output the same to the high-voltage terminals 12c, 12d and a step-down function to step down a voltage applied to the high-voltage terminals 12c, 12d and output the same to the low-voltage terminals 12a, 12b. That is, the voltage converter circuit 12 is a bidirectional DC-DC converter. A voltage of the regenerative power which the motor 92 generated is applied to the high-voltage terminals 12c, 12d. The voltage converter circuit 12 increases its current capacity by connecting the two power modules 4a and 4c in parallel as well as connecting the other two power modules 4b and 4d in parallel.

The inverter circuit 13 will be described. The inverter circuit 13 is provided with three power modules 6a to 6c. The three power modules 6a to 6c are connected in parallel between a positive electrode line 7p and a negative electrode line 7n. When one of the power modules 6a to 6c is mentioned without any distinction therebetween, it will be denoted as a power module 6. Each of the power modules 6 houses two switching elements and two diodes. The two switching elements are connected in series in a body of each power module 6. Each of the diodes is connected in inverse parallel to corresponding one of the switching elements. When the switching elements in the three power modules 6 are suitably turned on and off, AC power is outputted from a midpoint of each series connection of the two switching elements. The AC power outputted from the inverter circuit 13 is supplied to the motor 92. The inverter circuit 13 may in some cases convert the regenerative power (AC power) generated by the motor 92 to DC power and supply the same to the voltage converter circuit 12.

Figure 2:
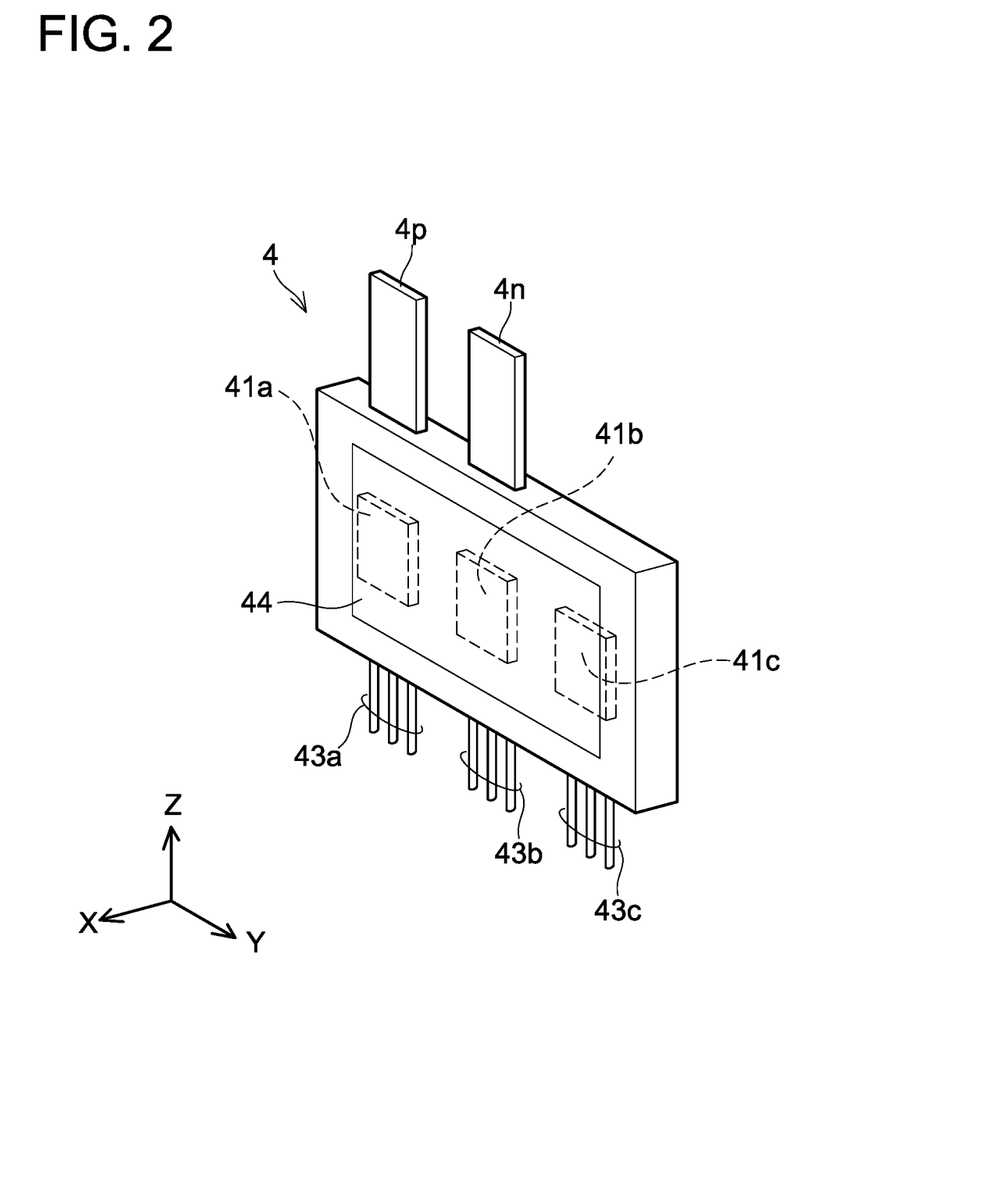
FIG. 2 is a perspective view of a power module.
Figure 3:
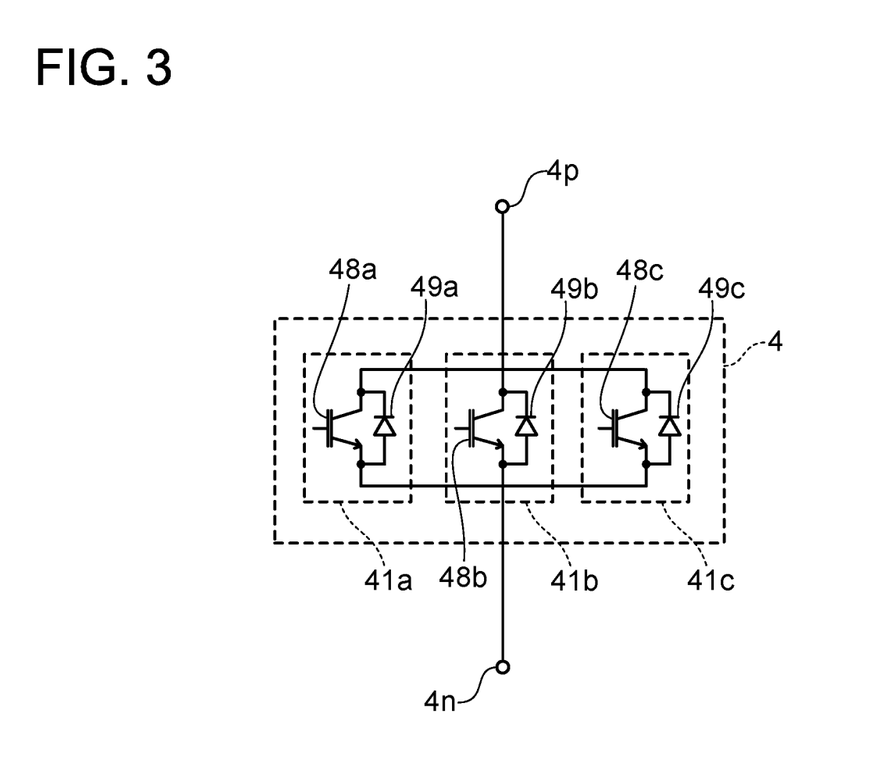
FIG. 3 is a circuit diagram in the power module.

The power modules 4 of the voltage converter circuit 12 and the power modules 6 of the inverter circuit 13 are different in their connection structures of the switching elements therein. An outer appearance of the power module 4 is shown in FIG. 2. The power module 4 houses three semiconductor chips 41a, 41b, 41c. FIG. 3 shows a circuit diagram inside the power module 4. Each semiconductor chip 41a (41b, 41c) houses an inverse parallel circuit including one switching element 48a (48b, 48c) and one diode 49a (49b, 49c). The three semiconductor chips 41a to 41c are connected in parallel inside the power module 4. That is, the three switching elements 48a to 48c are connected in parallel. The switching elements 48a to 48c are switching elements for power conversion, and are typically IGBTs (Insulated Gate Bipolar Transistors) or MOSFETs (Metal Oxide Semiconductor Field Effect Transistors).

Returning to FIG. 2, the explanation of the power module 4 will be resumed. The power module 4 has a flat shape, and a heat dissipating plate 44 is exposed at one wide-width surface thereof. A heat dissipating plate is also exposed at another wide-width surface of the power module 4 opposite to the one wide-width surface. A positive terminal 4p and a negative terminal 4n of the parallel connection of the three semiconductor chips 41a to 41 c extend from one narrow-width surface of the power module 4. Control terminals 43a to 43c extend from another narrow-width surface of the power module 4 opposite to the one narrow-width surface. The control terminals 43a (43b, 43c) include a gate terminal of the switching element of the semiconductor chip 41a (43b, 43c), a temperature sensor terminal and the like.

Figure 4:
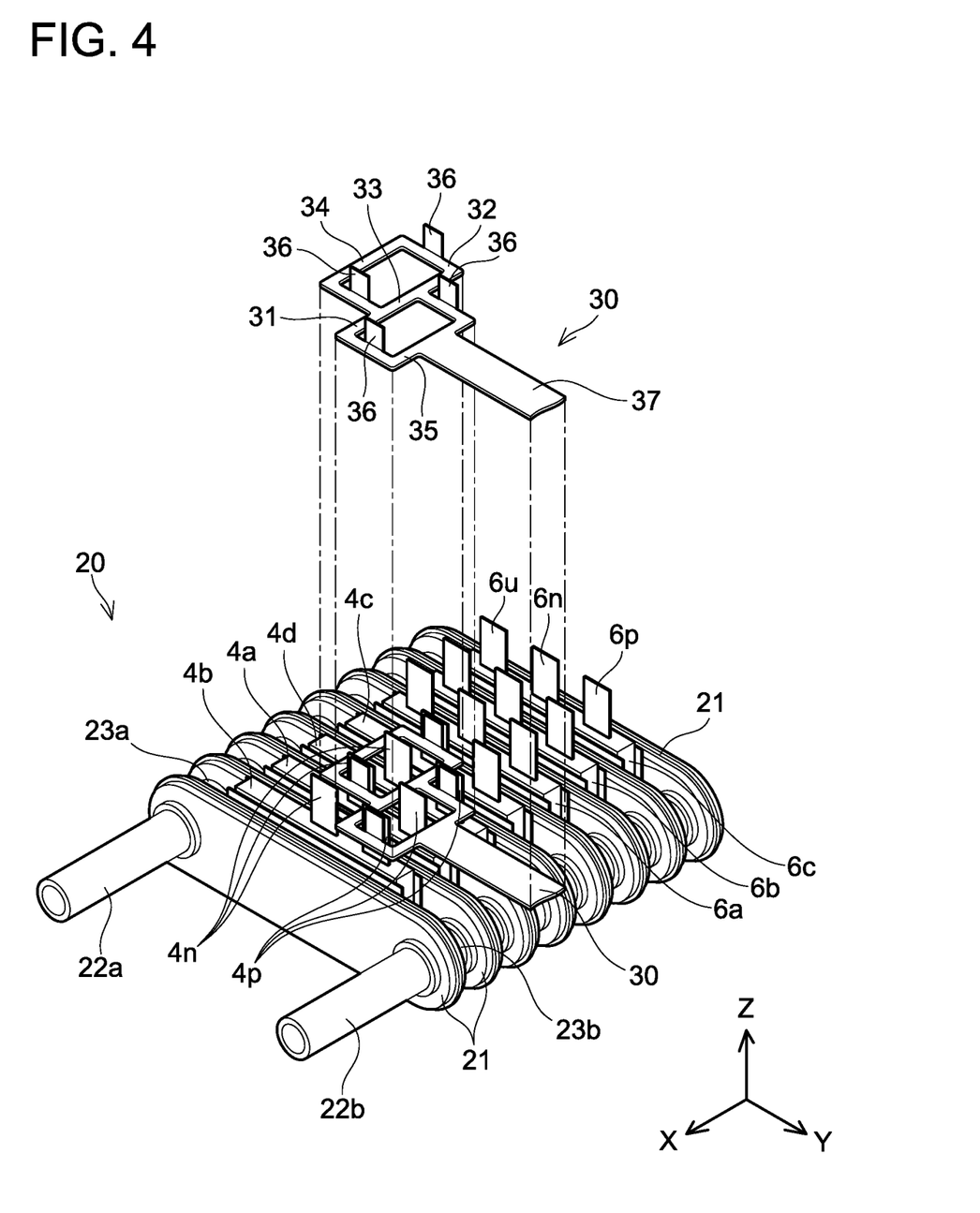
FIG. 4 is a (partial) perspective view of the power converter.
Figure 5:
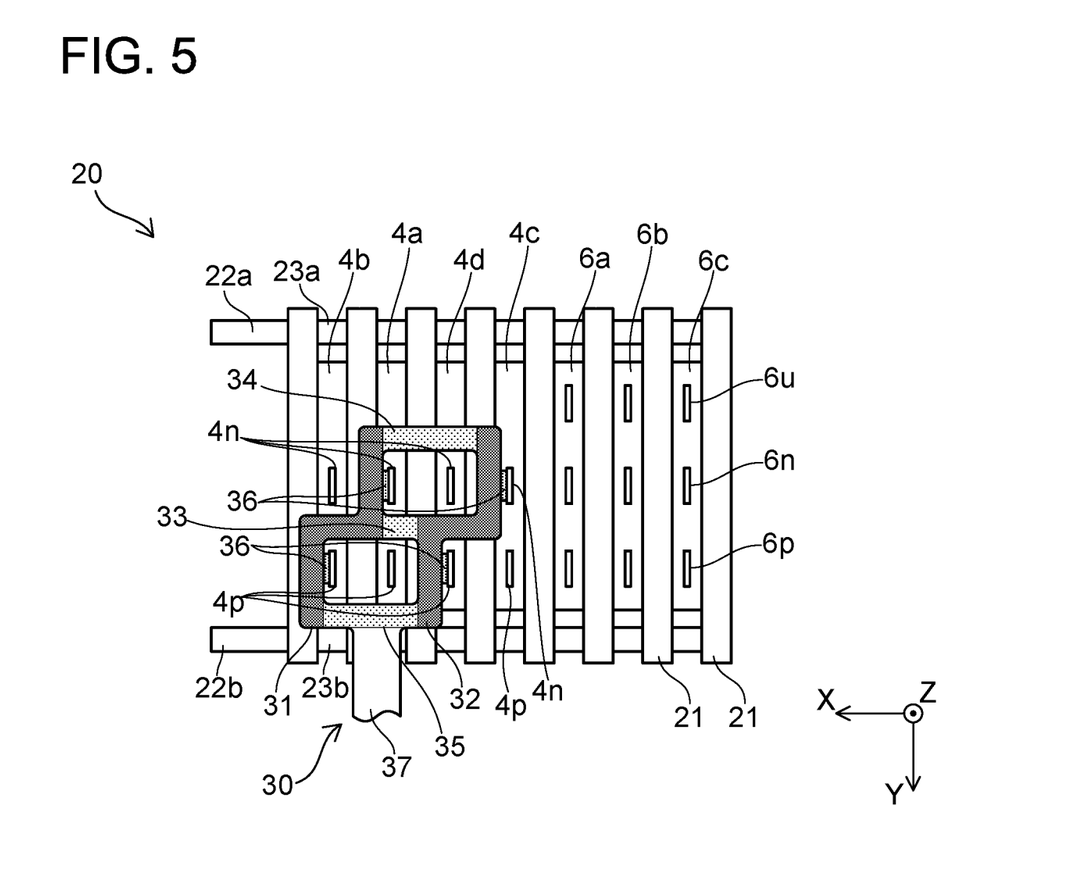
FIG. 5 is a (partial) plan view of the power converter.

The power modules 4a to 4d of the voltage converter circuit 12 and the power modules 6a to 6c of the inverter circuit 13 are assembled in a stack unit and are collectively cooled. FIG. 4 shows a perspective view of a stack unit 20 which is a part of the power converter 10. FIG. 5 shows a plan view of the stack unit 20. The stack unit 20 is a device in which the plurality of power modules 4, 6 is stacked with a plurality of coolers 21. The stack unit 20 is a primary component of the power converter 10.

The coolers 21 have a flat shape. The coolers 21 are arranged in an X direction with their flat surfaces facing each other. In FIGS. 4 and 5, the reference sign 21 is omitted for some of the coolers. One of the power modules 4 or one of the power modules 6 is interposed between each pair of the adjacent coolers 21. Each pair of the adjacent coolers 21 are connected by two connection pipes 23a, 23b. As seen along a stacking direction of the coolers and the power modules (the X direction), the connection pipes 23a, 23b are located on both sides of the power modules 4 (6), respectively. In FIGS. 4 and 5, the reference signs 23a, 23b are given only to one pair of the connection pipes, and the reference signs are omitted for the rest of the connection pipes.

A coolant supply pipe 22a and a coolant discharge pipe 22b are connected to the cooler 21 at an end of the arrangement of the plurality of coolers 21 (the cooler 21 at the left end in FIG. 5). The coolant supply pipe 22a is attached to a position overlapping the connection pipes 23a on one side as seen along the stacking direction (the X direction), and the coolant discharge pipe 22b is attached to a position overlapping the connection pipes 23b on the other side. The coolant supply pipe 22a and the coolant discharge pipe 22b are connected to a coolant circulator that is not shown. Coolant is supplied to the stack unit 20 through the coolant supply pipe 22a. A passage for the coolant is provided inside each cooler 21. The coolant is distributed to all the coolers 21 through the connection pipes 23a on the one side. The coolant absorbs heat from the power modules 4 (6) adjacent to the coolers 21 while it flows through the coolers 21. The coolant that had absorbed the heat is discharged from the stack unit 20 through the connection pipes 23b on the other side and the coolant discharge pipe 22b. The coolant is a liquid, and is typically water or anti-freeze solution.

The four power modules 4a to 4d of the voltage converter circuit 12 are arranged in the X direction. As described above, each of the power modules 4 is provided with the positive terminal 4p and the negative terminal 4n. The positive terminal 4p and the negative terminal 4n are arranged in a Y direction perpendicularly intersecting the X direction. The positive terminal 4p and the negative terminal 4n extend from the body of the power module 4 along a Z direction perpendicularly intersecting each of the X direction and the Y direction. The positive terminals 4p of the power modules 4 are arranged in a line in the X direction, and the negative terminals 4n thereof are also arranged in a line in the X direction.

The three power modules 6a to 6c of the inverter circuit 13 are also arranged in the X direction. Each of the power modules 6 is provided with a positive terminal 6p, a negative terminal 6n, and a midpoint terminal 6u. The positive terminal 6p corresponds to a positive electrode of the series circuit (the series circuit of the two switching elements) in the power module 6. The negative terminal 6n corresponds to a negative electrode of the series circuit. The midpoint terminal 6u corresponds to a midpoint of the series circuit. In FIGS. 4 and 5, the reference signs 6p, 6n, 6u are given only to the terminals of the power module 6c at the right end, and the reference signs are omitted for the rest of the power modules 6a, 6b.

FIGS. 4 and 5 also show a bus bar 30 that connects the power modules 4a and 4b (as well as 4c and 4d) in series and connects 4a and 4c (as well as 4b and 4d) in parallel. In FIGS. 4 and 5, depiction of other bus bars is omitted. A bus bar is a conductive member that is configured from a metal plate (or a metal bar) having a small internal resistance. The bus bar is a conductor that is suitable for high power transmission.

FIG. 4 depicts both the bus bar 30 separated from the stack unit 20 and the bus bar 30 attached to the stack unit 20. The bus bar 30 is configured from a single metal plate, however, for the sake of convenience of explanation, it will be described by dividing it into a first bus bar piece 31, a second bus bar piece 32, connecting bus bar pieces 33, 34, 35, and a base part 37. In FIG. 5, for easier understanding, the first bus bar piece 31 and the second bus bar piece 32 are hatched in dark gray and the connecting bus bar pieces 33, 34, 35 are hatched in light gray. The base part 37 is not hatched.

The first bus bar piece 31 extends in the Y direction and connects the negative terminal 4n of the power module 4a and the positive terminal 4p of the power module 4b. The power modules 4a and 4b are adjacent to each other in the X direction. The first bus bar piece 31 is provided with two tabs 36 that are bent at a right angle. One of the tabs 36 is connected to the negative terminal 4n of the power module 4a and the other of the tabs 36 is connected to the positive terminal 4p of the power module 4b.

The second bus bar piece 32 extends in the Y direction and connects the negative terminal 4n of the power module 4c and the positive terminal 4p of the power module 4d. The power modules 4c and 4d are adjacent to each other in the X direction. The second bus bar piece 32 is provided with two tabs 36 that are bent at a right angle. One of the tabs 36 is connected to the negative terminal 4n of the power module 4c and the other of the tabs 36 is connected to the positive terminal 4p of the power module 4d.

The three connecting bus bar pieces 33, 34, 35 extend in the X direction and connect the first bus bar piece 31 and the second bus bar piece 32. The connecting bus bar piece 33 connects a center of the first bus bar piece 31 in the Y direction and a center of the second bus bar piece 32 in the Y direction. The connecting bus bar piece 34 connects a distal end of the first bus bar piece 31 and a distal end of the second bus bar piece 32. The connecting bus bar piece 35 connects a base end of the first bus bar piece 31 and a base end of the second bus bar piece 32. One end of the base part 37 is connected to the connecting bus bar piece 35. Although not shown, another end of the base part 37 is connected to the reactor 3 (see FIG. 1).

The first bus bar piece 31 extending in the Y direction connects the power modules 4a and 4b in series and the second bus bar piece 32 extending in the Y direction connects the power modules 4c and 4d in series. Further, the three connecting bus bar pieces 33 to 35 extending in the X direction connect the first bus bar piece 31 and the second bus bar piece 32. That is, the three connecting bus bar pieces 33 to 35 connect the power modules 4a and 4c in parallel and the power modules 4b and 4d in parallel.

In the power converter 10, the power modules are connected in parallel to increase the current capacity. By connecting the power modules (the switching elements) in parallel, current is distributed to the power modules (the switching elements), by which the current capacity of the power converter 10 as a whole increases. As shown in FIGS. 2 and 3, the three switching elements are connected in parallel in each one of the power modules 4. By connecting two of the power modules in parallel, the parallel connection of six switching elements is realized. The six switching elements connected in parallel operate in synchrony and therefore behave as if they were a single power module.

If there is a resistance difference between current paths of the power modules connected in parallel, load distribution becomes uneven. In such a case, deterioration progresses faster in a power module with a high load than in a power module with a low load. Further, there is the resistance difference between the current paths of the power modules (the switching elements) connected in parallel, a so-called gate oscillation is more likely to occur. The resistance difference between the power modules connected in parallel is desirably small.

In the power converter 10 according to the embodiment, the power modules 4a and 4c (as well as 4b and 4d) are connected in parallel by the bus bar 30. The first bus bar piece 31 extending in the Y direction connects the power modules 4a and 4b in series and the second bus bar piece 32 extending in the Y direction connects the power modules 4c and 4d in series. Further, the three connecting bus bar pieces 33 to 35 extending along the X direction connect the first bus bar piece 31 and the second bus bar piece 32 by a shortest distance. The connecting bus bar piece 33 connects the center of the first bus bar piece 31 in the Y direction and the center of the second bus bar piece 32 in the Y direction. The positive terminals 4p and the negative terminals 4n extend along the Z direction, and the connecting bus bar piece 33 extends between the positive terminal 4p and the negative terminal 4n of the power module 4a. According to this shape of the bus bar 30, the resistance difference between the power modules 4a and 4c (as well as between 4b and 4d) connected in parallel can be reduced. By employing the bus bar 30, the difference in loads of the power modules is reduced, and the gate oscillation is less likely to occur.

Further, with the three connecting bus bar pieces 33 to 35 connecting the power modules 4a and 4c (as well as 4b and 4d) in parallel by the shortest distance, a parasitic inductance in the bus bar 30 can be suppressed.

Figure 6:
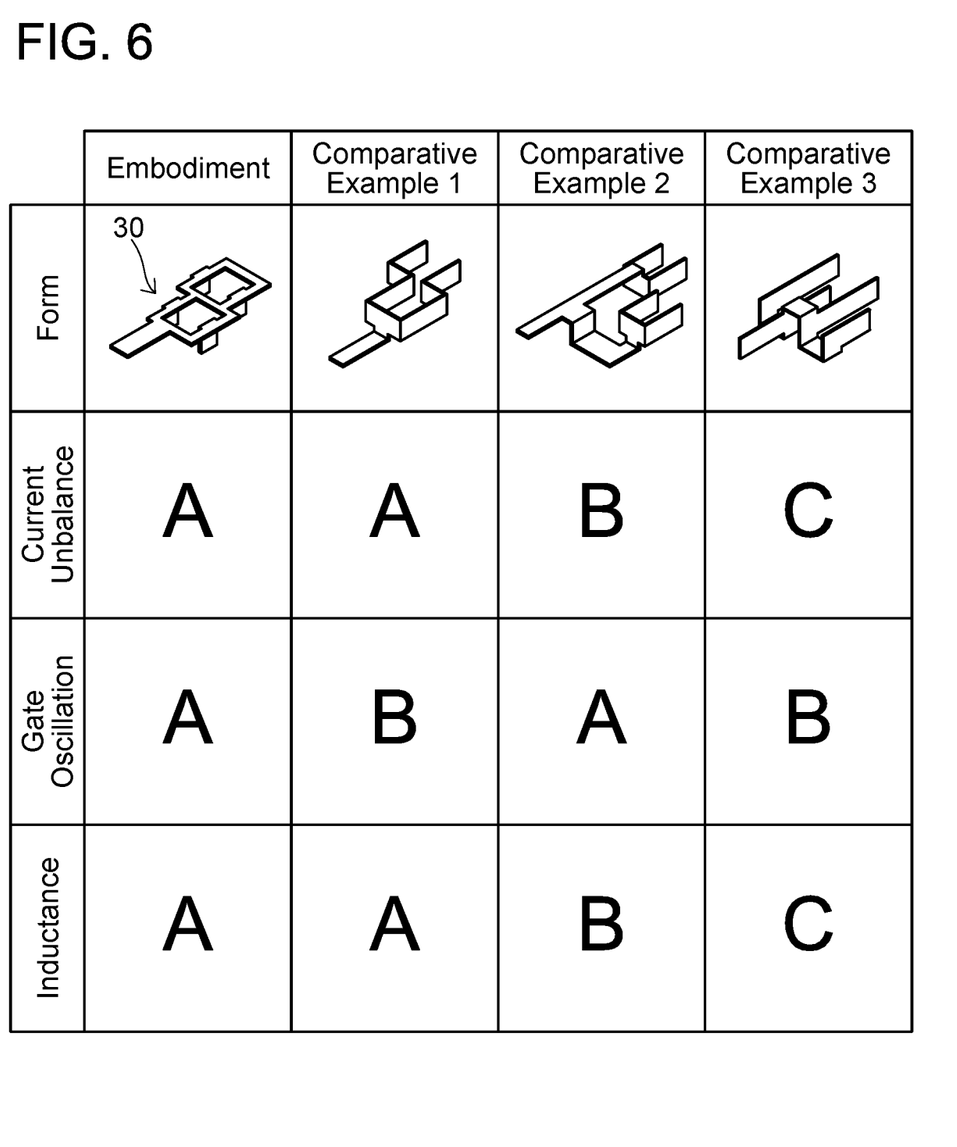
FIG. 6 is a comparison table for characteristics between a bus bar employed in the embodiment and bus bars of comparative examples 1 to 3.

FIG. 6 shows a comparison table for characteristics between the bus bar 30 employed in the power converter 10 of the embodiment and three types of bus bars (comparative examples 1 to 3) having different shapes. Characteristics were compared for three items, namely, current unbalance, gate oscillation, and inductance. A leftmost column in FIG. 6 is for the bus bar 30. The bus bar 30 in FIG. 6 is depicted upside down with respect to the bus bar 30 shown in FIG. 4.

The characteristic for each item was evaluated based on relative performances of the four types of bus bars. "A" indicates that the bus bar exhibited the best performance among the four types of shapes. "B" indicates that the bus bar exhibited the second best performance among the four types of shapes. "C" indicates that the bus bar exhibited the third best or poorest performance among the four types of shapes. The bus bar 30 employed in the power converter 10 of the embodiment achieved the evaluation "A" in all of the items.

Figure 7:
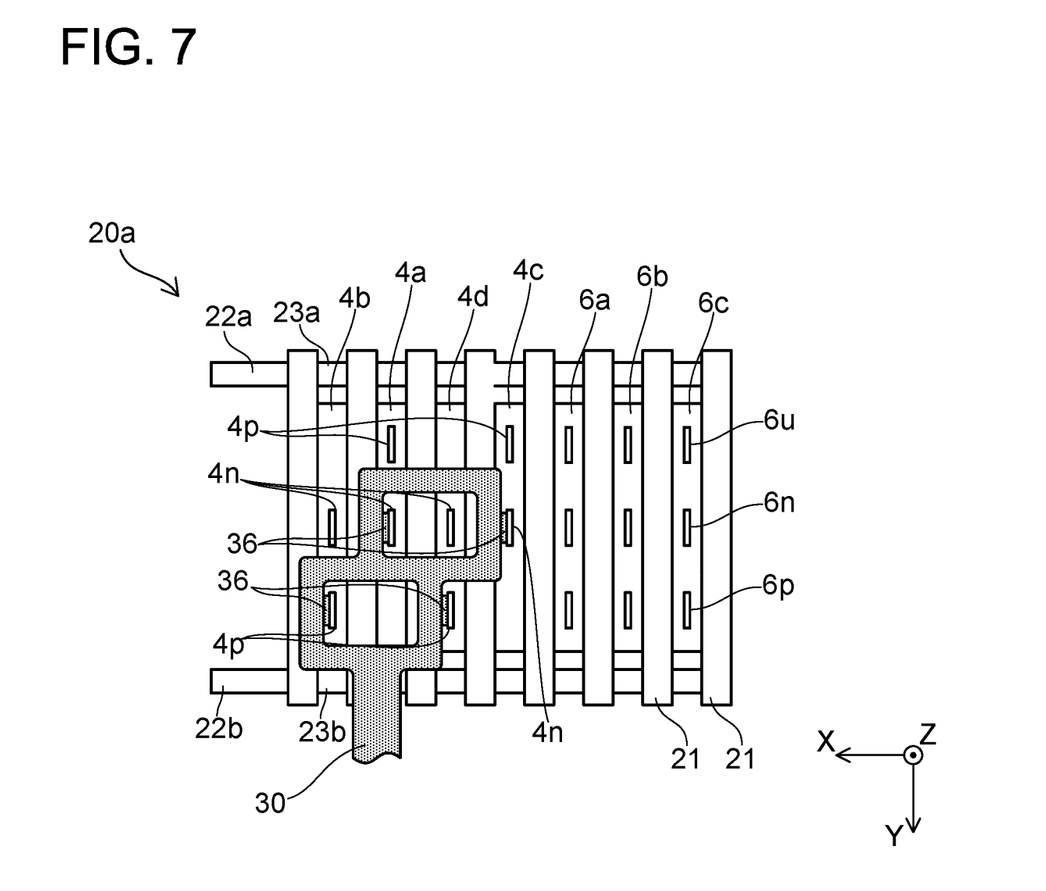
FIG. 7 is a plan view of a power converter according to a variant.

(Variant) FIG. 7 shows a plan view of a stack unit 20a of a variant (a power converter of a variant). In FIG. 7, an entirety of the bus bar 30 is hatched in gray. The shape of the bus bar is same as that of the bus bar in the power converter 10 (the stack unit 20) of the embodiment. In FIG. 7, the reference signs (31 to 37) indicating the respective parts of the bus bar 30 are omitted.

In this variant, the power modules 4a and 4b are arranged to face each other. That is, the positive terminal 4p of the power module 4a and the positive terminal 4p of the power module 4b are not aligned in the X direction. In FIG. 7, the positive terminal 4p of the power module 4a is located on a −Y side relative to the negative terminal 4n thereof and the positive terminal 4p of the power module 4b is located on a +Y side relative to the negative terminal 4n thereof. On the other hand, the negative terminals 4n of the power modules 4a, 4b are respectively located at centers of the power modules 4a, 4b in the Y direction. Due to this, even when the power modules 4a, 4b are arranged to face each other, the two negative terminals 4n face each other in the X direction. The power modules 4c, 4d are arranged to face each other in the same manner. In this case as well, the bus bar which is the same as the bus bar 30 of the embodiment may be used.

Some features related to the technique described in the embodiment will be described. In the power converter 10 of the embodiment, the first bus bar piece 31 and the second bus bar piece 32 are connected by the three connecting bus bar pieces 33 to 35. Further, one connecting bus bar piece 33 connects the centers of the first bus bar piece 31 and the second bus bar piece 32 in the Y direction. There may be at least two connecting bus bar pieces connecting the first bus bar piece 31 and the second bus bar piece 32. Further, one of those two may connect the centers of the first bus bar piece and the second bus bar piece in the Y direction.

The power modules 4a to 4d respectively correspond to examples of first to fourth power modules. The X direction, the Y direction, and the Z direction in a coordinate system in the drawings respectively correspond to a first direction, a second direction, and a third direction.

Each power module 4 in the embodiment houses the three switching elements connected in parallel. The technique disclosed herein may be applied to a power converter using power modules each of which houses two switching elements connected in parallel. Further, the technique disclosed herein may be applied to a power converter using a plurality of power modules connected in parallel, each of which houses one switching element. Moreover, the technique disclosed herein may be applied to a power converter using power modules connected in parallel, each of which houses four or more switching elements connected in parallel.

Specific examples of the present disclosure have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A power converter comprising:
   four power modules arranged in a first direction, the four power modules including a first power module, a second power module, a third power module, and a fourth power module, each of the four power modules housing a switching element; and
   a bus bar connecting the four power modules,
   wherein
   each of the four power modules comprises a positive terminal and a negative terminal, each of the positive terminal and the negative terminal being electrically connected to the switching element,
   the positive terminals and the negative terminals are arranged in a second direction intersecting the first direction,
   the positive terminals and the negative terminals extend along a third direction intersecting both of the first direction and the second direction,
   the bus bar comprises:
      a first bus bar piece connecting the negative terminal of the first power module and the positive terminal of the second power module adjacent to the first power module;
      a second bus bar piece connecting the negative terminal of the third power module and the positive terminal of the fourth power module adjacent to the third power module; and
      a plurality of connecting bus bar pieces connecting the first bus bar piece and the second bus bar piece, the plurality of connecting bus bar pieces extending along the first direction, and
   at least one of the connecting bus bar pieces connects a center of the first bus bar piece in the second direction and a center of the second bus bar piece in the second direction.

2. The power converter as in claim 1, wherein
the at least one of the connecting bus bar pieces extends between the positive terminal and the negative terminal of any one of the four power modules.

3. The power converter as in claim 1, wherein
the first bus bar piece, the second bus bar piece, and the plurality of connecting bus bar pieces are configured from a single metal plate.

4. The power converter as in claim 1, wherein
each of the four power modules houses a plurality of switching elements including the switching element, the plurality of switching elements being connected in parallel.

5. The power converter as in claim 1, wherein
each of the four power modules comprises the negative terminal at a center of the power module in the second direction.

* * * * *